(12) United States Patent
deVilliers (10) Patent No.: US 10,338,466 B2
(45) Date of Patent: Jul. 2, 2019

(54) SYSTEM AND METHOD FOR PLANARIZING A SUBSTRATE

(71) Applicant: Tokyo Electron Limited, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 204 days.

(21) Appl. No.: 15/094,362

(22) Filed: Apr. 8, 2016

(65) Prior Publication Data

US 2016/0300726 A1    Oct. 13, 2016

Related U.S. Application Data

(60) Provisional application No. 62/146,480, filed on Apr. 13, 2015.

(51) Int. Cl.
| | |
|---|---|
| *G03F 7/00* | (2006.01) |
| *G03F 7/32* | (2006.01) |
| *H01L 21/027* | (2006.01) |
| *H01L 21/3105* | (2006.01) |
| *G03F 7/40* | (2006.01) |
| *G03F 7/20* | (2006.01) |

(52) U.S. Cl.
CPC .............. *G03F 7/0035* (2013.01); *G03F 7/32* (2013.01); *G03F 7/40* (2013.01); *G03F 7/70291* (2013.01); *H01L 21/0273* (2013.01); *H01L 21/31058* (2013.01)

(58) Field of Classification Search
CPC .................................. G03F 7/0035; G03F 7/40
See application file for complete search history.

(56) References Cited

U.S. PATENT DOCUMENTS

| | | |
|---|---|---|
| 6,541,401 B1 | 4/2003 | Herner et al. |
| 6,645,851 B1 | 11/2003 | Ho et al. |
| 2002/0106886 A1 | 8/2002 | Sethuraman et al. |
| 2002/0155389 A1 | 10/2002 | Rangarajan et al. |
| 2015/0214056 A1* | 7/2015 | Xu .................. H01L 21/266 438/514 |
| 2016/0300711 A1* | 10/2016 | Rathsack ............ H01L 21/0273 |

FOREIGN PATENT DOCUMENTS

JP    2005-310807    11/2005

OTHER PUBLICATIONS

International Patent Application No. PCT /US20 16/026682, "International Search Report and Written Opinion," International Filing Date Apr. 8, 2016, International Search Report and Written Opinion dated Jun. 30, 2016.

* cited by examiner

*Primary Examiner* — Kathleen Duda
(74) *Attorney, Agent, or Firm* — Oblon, McClelland, Maier & Neustadt, L.L.P.

(57) ABSTRACT

Techniques include providing selective or differential planarization such that different regions of a substrate can have different amounts of material removed. In general, methods herein use photo-reactive generator compounds to generate solubility-changing agents. A specific pattern of light is projected onto a substrate containing such photo-reactive generator compounds to create different concentrations of solubility-changing agent(s) at specific locations across a substrate. As generated solubility-changing agents are diffused into an underlying layer, these concentration differences then control an amount (height or depth) of material removed from a given film or layer at specific spatial locations on the substrate.

8 Claims, 4 Drawing Sheets

SYSTEM AND METHOD FOR PLANARIZING A SUBSTRATE

CROSS REFERENCE TO RELATED APPLICATIONS

The present application claims the benefit of U.S. Provisional Patent Application No. 62/146,480, filed on Apr. 13, 2015, entitled "System and Method for Planarizing a Substrate," which is incorporated herein by reference in its entirety.

BACKGROUND OF THE INVENTION

This disclosure relates to microfabrication including microfabrication of integrated circuits.

Semiconductor manufacturing includes photolithographic and patterning processes. Some photolithographic processes include coating a wafer with a thin film of bottom anti-reflective coating (BARC) material, followed by coating with a resist, and then exposing the wafer to a pattern of light as one of many process steps for creating microchips. Photolithographic and patterning processes typically benefit from a planar surface for depositing the various films and resists used to pattern and expose a wafer. Films can be specified to have a particular height and be planarized to within certain dimensions, depending on a given fabrication process.

Planarization is commonly performed using a process known as Chemical Mechanical Polishing (CMP). CMP is a process that uses corrosive chemicals and a polishing pad to planarize the surface of a wafer, similar to how wet sanding works. CMP can planarize insulators and conductors in multilevel structures. This planarization is used to stack more electronics onto another layer of a wafer, or to planarize the wafer for photo lithographic patterning. CMP is also used to fine tune the lithographic exposure process by setting a resist to a known height to optimize the exposure surface.

SUMMARY

Although chemical mechanical polishing can provide a planar surface on a wafer, there are limitations and drawbacks to using CMP. CMP is typically executed by applying spin-on glass (SOG) on a wafer and then using corrosive chemicals and physical abrasion. Thus, CMP is a very harsh and physically abrasive process compared to other microfabrication techniques. CMP, therefore, cannot be used for many process steps of microfabricating an integrated circuit. For example, CMP cannot be used for microfabricating transistors and other front-end-of-line structures—especially when a gate oxide is exposed. Moreover, CMP processes are very expensive to run, challenging to perform, and typically reduce yield of functional integrated circuits.

Techniques disclosed herein provide a chemical-based planarization process without mechanical polishing. Techniques include providing selective or differential planarization such that different regions of a substrate can have different amounts of material removed. In general, methods herein use photo-reactive generator compounds to generate solubility-changing agents. A specific pattern of light is projected onto a substrate containing such photo-reactive generator compounds to create different concentrations of solubility-changing agent(s) across a substrate. These concentration differences then control an amount of material removed from a given film or layer.

One embodiment includes a method of planarizing a substrate. This method includes receiving a substrate having micro-fabricated structures formed thereon. The micro-fabricated structures are positioned on an upper portion of the substrate. At least a portion of the micro-fabricated structures define open spaces between each other. A filler layer of filler material is deposited on the substrate. The filler layer fills spaces between the micro-fabricated structures and covers at least a portion of the micro-fabricated structures. The filler layer results in a top surface that is non-planar in that top surface locations of the filler layer differ in z-height compared to each other by approximately 1-100 nanometers or more. A generator compound is deposited on the filler layer. The generator compound is a compound that generates a solubility-changing agent in response to receiving actinic radiation exposure. A pattern of actinic radiation is projected onto the substrate. The pattern of actinic radiation is projected using a digital pixel-based projection system having an array of independently addressable projection points, or, alternatively, a mask-based photolithographic exposure system. The solubility-changing agent is caused to diffuse into at least a portion of the filler layer such that the solubility-changing agent changes a solubility of a top portion of the filler layer. This now soluble top portion can be removed and then any number of subsequent photolithographic, patterning, or microfabrication processes can be executed.

Introducing a photo acid generator and using projected light patterns to release photo acid as disclosed herein provides a highly controllable and accurate method to adjust z-height on a substrate, which can include using a laser galvanometer or digital light projection (DLP) chip providing light dose variation across a substrate. The result is a non-abrasive planarization process that can be finely controlled both spatially (across the wafer) and vertically (amount of material removed). These methods can provide selective planarization per die and selective planarization within each die. Such techniques can be executed using multiple tools, or within a single tool system, such as a coater/developer tool (also known as a track tool) commonly used for microfabrication. Planarization techniques herein can also be used for stacked die parts, including die or die-to-wafer configurations, and can planarize even with high topography and sharp edges of die configurations.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein provide a chemical-based planarization process without mechanical polishing. Techniques include providing selective or differential planarization such that different regions of a substrate can have different amounts of material removed. In general, methods herein use photo-reactive generator compounds to generate solubility-changing agents. A specific pattern of light is projected onto a substrate containing such photo-reactive generator compounds to create different concentrations of solubility-changing agent(s) at specific locations across a substrate. These concentration differences then control an amount (height or depth) of material removed from a given film or layer at each specific location.

Figure 1:
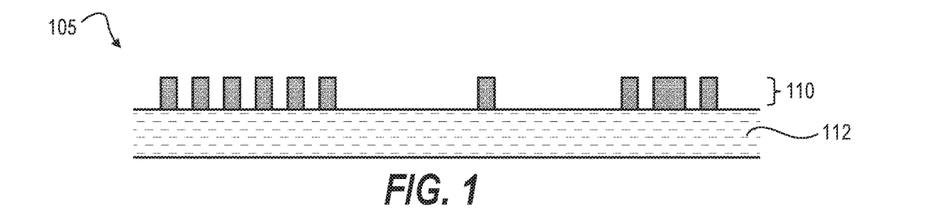
FIG. 1 is a cross-sectional schematic view of an example substrate segment showing a process flow according to embodiments disclosed herein.

There are several embodiments encompassed by techniques herein. FIGS. 1-8 illustrate one example embodiment for planarizing a substrate. Referring now to FIG. 1, a substrate 105 is received having micro-fabricated structures 110 formed thereon. Note that "receiving" a substrate can include providing, receiving, creating or otherwise generating such a substrate. For example, the substrate 105 can be received from a separate tool or from within a same tool, or can refer to simply placing substrate 105 on a substrate holder of a process chamber or accepting a substrate for continued processing. The micro-fabricated structures 110 being positioned on an upper portion of the substrate 105 and can be positioned on an underlying layer 112. At least a portion of the micro-fabricated structures define open spaces between each other. A given arrangement, pattern, shape, and type of structures can be determined by type of device being created, (memory, logic, dummy structures, etc.). In other words, the micro-fabricated structures 110 can essentially be protruding from a top portion or working surface of substrate 105 and thus are uncovered or open for subsequent processing. Such structures can have different spatial densities across a substrate, and can differ in height relative to each other, which can depend on a particular design of a fabricator.

Figure 2:
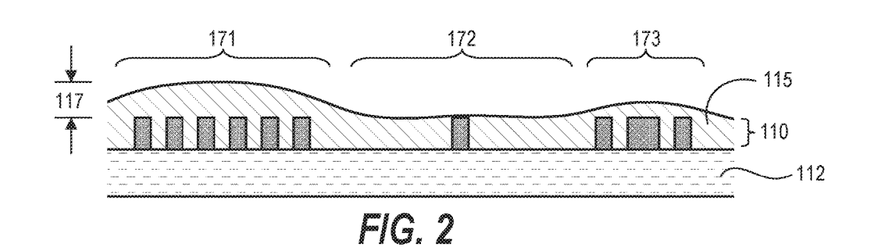
FIG. 2 is a cross-sectional schematic view of an example substrate segment showing a process flow according to embodiments disclosed herein.

A filler layer 115 of filler material is deposited on the substrate 105. The filler layer fills spaces between the micro-fabricated structures 110 and covers at least a portion of the micro-fabricated structures 110. An example result is shown in FIG. 2. The filler layer 115 results in a top surface that is non-planar in that top surface locations of the filler layer differ in z-height compared to each other by approximately 1-100 nanometers or more. Dimension 117 shows a relative difference in z-height of filler layer 115 from a tallest z-height to a shortest z-height of the filler layer.

Note that such a resulting nonplanar filler layer can have z-height variations based on a particular pattern of structures on a working surface of the substrate. For example, various films and substrate coatings are conventionally deposited by spin-on deposition. When a given topology or relief pattern has regions of densely arranged structures, this density can push deposition material upward and manipulate a mass fraction of how much material can go into spaces. In regions of sparsely arranged or populated features (for example, where there is a single line without other features nearby), the filler material can settle down into these larger pockets such that a deposited z-height at these locations can be approximately a height of isolated features. Most substrates being manufactured have some type of variable topography. Thus, in a typical substrate, there will be areas with relatively dense arrangement of structures, and areas with few or fewer lines and structures. When a film is deposited to cover and/or fill-in such a topology, the result is typically a film with an uneven or nonplanar surface. Note that in substrate 105 there is a higher density or higher duty cycle of features in region 171 of FIG. 2, a medium density of features in region 173, and a lower density of features in region 172. Note also how the higher density features push up the filler layer material as compared to other regions of the substrate.

This non-planarity of the surface is typically non-preferred. It is often desired to be able to have a fill material that results in a planar or horizontal top surface so that tops of structures are uncovered or even protruding somewhat (perhaps 10%) from the filler layer because such a recessed filler layer can enable a reversal process, targeted deposition/doping, etc.

Depositing the filler layer of filler material can include depositing a developable material. The developable material has material properties that result in such material having a solubility shift in response to presence of solubility-changing agents at or above a predetermined concentration threshold. Various materials can be selected for use. Such materials can include hard mask materials and anti-reflective coating materials. By way of a non-limiting example, a silicon-containing developable bottom anti-reflective coating film can be deposited as the filler layer.

Figure 3:
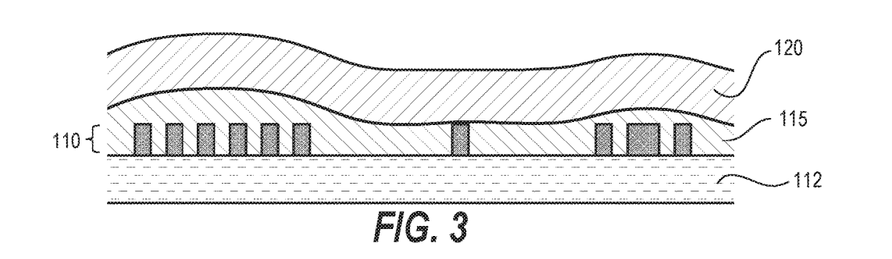
FIG. 3 is a cross-sectional schematic view of an example substrate segment showing a process flow according to embodiments disclosed herein.

A generator compound can then be deposited on the filler layer. The generator compound is a compound that generates a solubility-changing agent in response to receiving actinic radiation exposure. An example generator compound can be a photo acid generator (PAG) or a photo base generator. The generator compound is a compound that creates or releases a solubility-changing agent in response to exposure to an activating wavelength of light. In some embodiments, the generator compound can include two or more different types of PAGs. An example result is shown in FIG. 3. Height-adjustment layer 120 can include one or more generator compounds, or be entirely comprised of PAGs. Note that the thicknesses shown in the Figures are not to scale, but instead are schematic representations.

Figure 4:
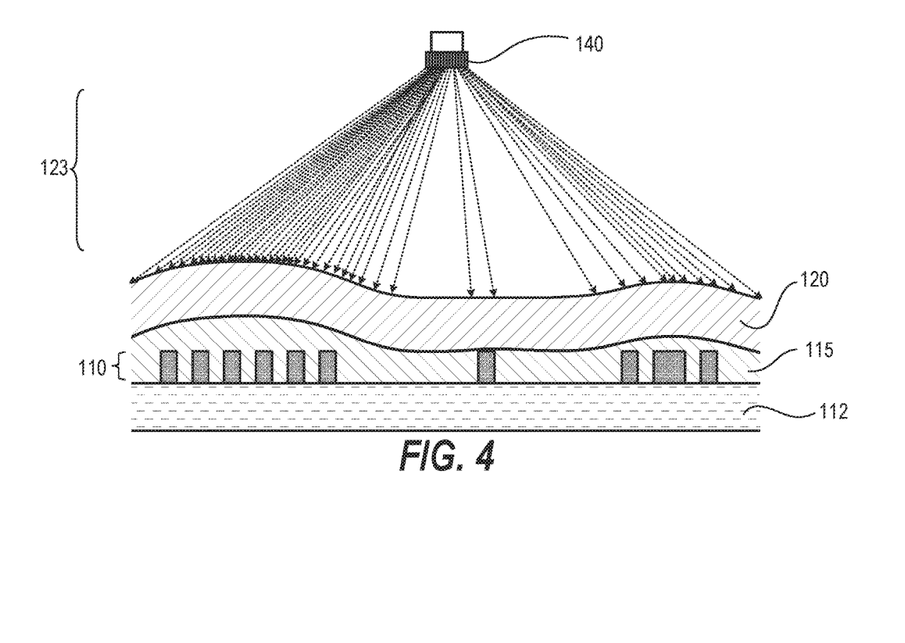
FIG. 4 is a cross-sectional schematic view of an example substrate segment showing a process flow according to embodiments disclosed herein.

With the generator compound on the substrate 105, a pattern of actinic radiation is projected onto the substrate. The pattern of actinic radiation can be projected using a digital pixel-based projection system having an array of independently addressable projection points. For example, a laser galvanometer, digital light projection (DLP) chips, grating light valves (GLV), microelectromechanical systems (MEMS) mirrors and other light valve and/or micro projection devices can be used, or any pixelated light source. FIG. 4 shows a schematic example of projecting such a pattern of radiation or light using micro projection device 140. Note that projection 123 has more projected radiation or projected light at some regions of the substrate as compared to other regions. When the projection is executed using some projection devices, such as a DLP chip, then such projection can vary intensity (for example grayscale for visible light) based on each given planar coordinate location on substrate 105. Exposure intensity at a given planar coordinate location on the substrate can be accomplished by controlling light intensity as well as frequency (for example, by flashing light). Also note that in the example in FIG. 4, regions of relatively greater z-height receive more radiation, whereas regions of relatively lesser z-height can receive less or no projected radiation. Depending on a particular light projection device being use, the pattern or radiation (image) can be projected simultaneously (as in the case of a DLP system), or as a line-by-line scan (as in the case of a laser galvanometer), or other method of addressable point projection.

Figure 5:
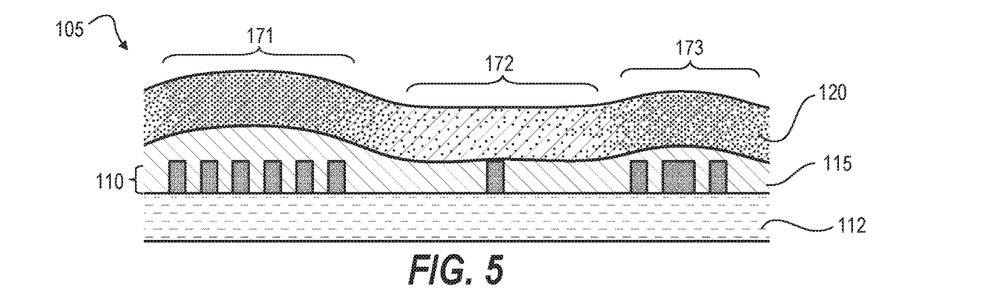
FIG. 5 is a cross-sectional schematic view of an example substrate segment showing a process flow according to embodiments disclosed herein.

The pattern of actinic radiation causes the generator compound to generate the solubility-changing agent. The solubility-changing agent is generated such that a concentration of the solubility-changing agent generated at a given point location on the substrate is selectably controlled by an exposure intensity of actinic radiation at the given point location. In some embodiments, projected light or radiation can be varied in intensity, such as by grayscale variation or an amount of light permitted to be projected. In other words, regions of the substrate that receive more light will in turn generate relatively more photo acid, while areas receiving relatively less light will in turn generate relatively less photo acid. FIG. 5 illustrates one example result of generating variable concentrations of one or more solubility-changing agents across a cross-section of a substrate. The dots within height-adjustment layer 120 represent instances of a solubility-changing agent having been generated. Note that in region 171 there is a relatively high concentration of solubility-changing agent generated over an area of high feature density of underlying structures. In contrast, region 172 has a relatively low concentration of solubility-changing agent generated over an area of low feature density of underlying structures. In region 172 there is a relatively moderate concentration of solubility-changing agent generated over an area of moderate feature density of underlying structures. Thus, spatially differential acid concentrations can be created based on a projection or exposure pattern and angle. Note that feature density is only one cause of z-height differences across a substrate. Additional overlay and fabrication effects can cause non-uniformities as well.

The pattern of actinic radiation projected onto the substrate can be based on a z-height signature that spatially characterizes z-height values of the top surface of the filler layer across the substrate. This z-height signature can be generated based on a topology of various micro fabricated structures on a given substrate. The z-height signature can essentially map a substrate and identify planar coordinate (e.g. x,y) locations across a substrate and a corresponding z-height value or expected z-height value for those planar coordinate locations. The pattern of actinic radiation can then create a concentration of photo acid at a given spatial location on the substrate based on the z-height signature. An amount of solubility-changing agent generated at each projected pixel location on the substrate is based on an intensity of actinic radiation projected at each pixel location, which intensity is controlled by the z-height signature and projected pattern.

Figure 15:
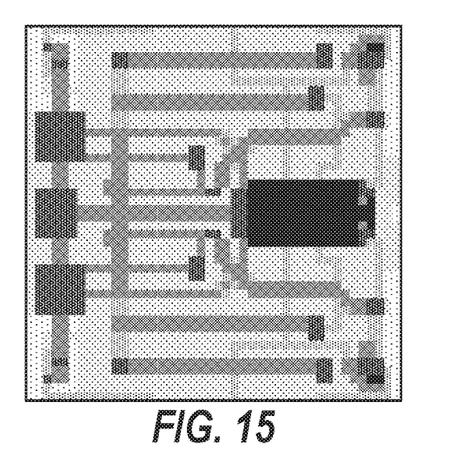
FIG. 15 is a representation of a z-height signature map according to embodiments disclosed herein.

FIG. 15 is a representation of a given z-height signature and/or pattern of actinic radiation being projected. A given z-height signature can provide topography information for an entire substrate surface. In the example projection shown in FIG. 15, this projection or z-height signature is shown for a segment of a substrate, such as for a given die or chip. In this illustration, the differences in fill patterns can represent differences in projected intensity onto a given substrate. For example, the darker fill regions can represent areas of greater intensity of projected radiation, which can correspond to a greater density of underlying structures causing a greater z-height of a given filler material.

Figure 6:
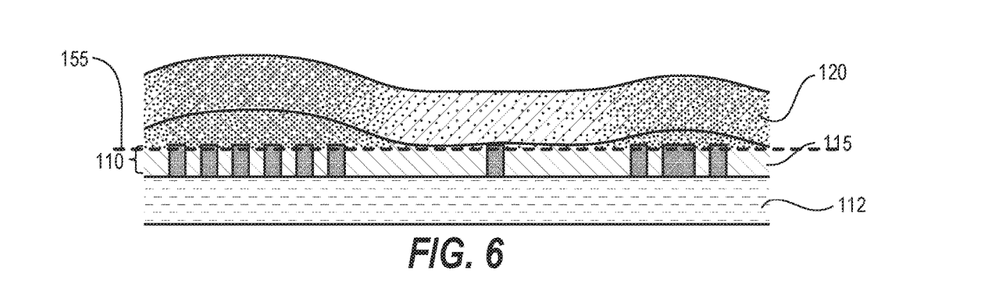
FIG. 6 is a cross-sectional schematic view of an example substrate segment showing a process flow according to embodiments disclosed herein.

The solubility-changing agent is then caused to diffuse into at least a portion of the filler layer 115 such that the solubility-changing agent changes a solubility of a top portion of the filler layer 115. This diffusion can be caused by application of heat, such as by baking the substrate. For example, baking a substrate having generated photo acid can cause the photo acid to diffuse into an underlying layer of developable material. An average diffusion length or vertical diffusion distance is a function of several factors including molecular weight of a particular photo acid, baking temperature, baking time, type of developable material, and so forth. This diffusion can be controlled very precisely, such as to within a few nanometers and even less than a nanometer. FIG. 6 shows an example illustration of solubility-changing agent having diffused into a top portion of filler layer 115. Line 155 is shown to designate a top portion of the filler layer 115 that is now soluble because of the concentration of solubility-changing agent now within the top portion.

Figure 7:
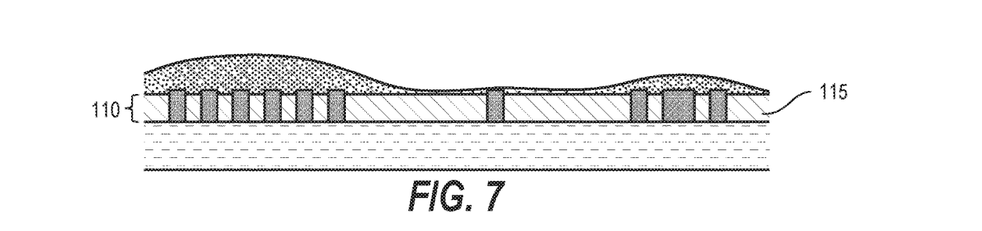
FIG. 7 is a cross-sectional schematic view of an example substrate segment showing a process flow according to embodiments disclosed herein.
Figure 8:
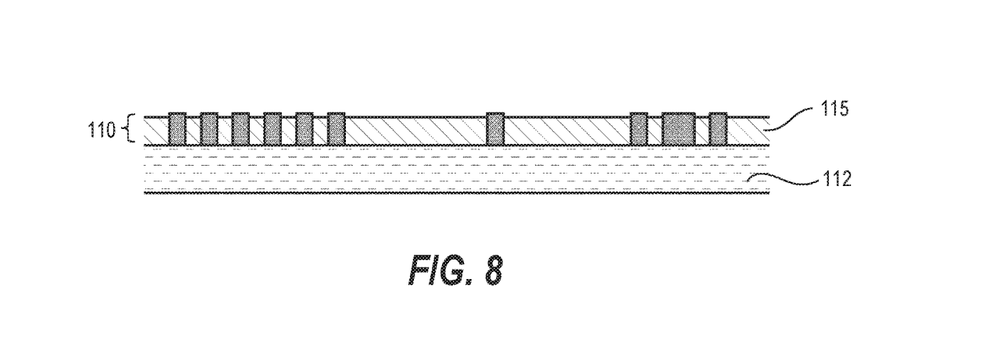
FIG. 8 is a cross-sectional schematic view of an example substrate segment showing a process flow according to embodiments disclosed herein.

Referring now to FIG. 7, the height-adjustment layer 120 can then be removed as one option. Soluble top portion of the filler layer 115 can also be removed. A result of removing the soluble top portion is shown in FIG. 8. Note that the height-adjustment layer 120 and soluble top portions of the filler layer 115 can be removed in a same step and/or using a same developing agent. Developing agents and photo acid generators are known and thus various combinations can be selected for use with embodiments herein. These techniques can thus be used to non-destructively planarize a substrate including planarizing to tops of underlying structures and even recessing a filler layer below tops (top surfaces) of underlying structures.

Figure 9:
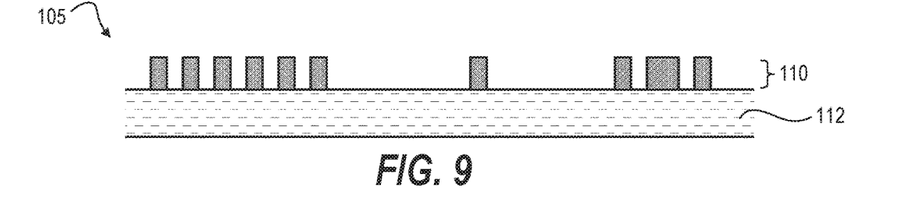
FIG. 9 is a cross-sectional schematic view of an example substrate segment showing a process flow according to embodiments disclosed herein.

Another embodiment can include incorporating a generator compound within the filler layer. Thus, a method of planarizing a substrate can include receiving a substrate having micro-fabricated structures formed thereon. The micro-fabricated structures are positioned on an upper portion of the substrate. At least a portion of the micro-fabricated structures define open spaces between each other. FIG. 9 shows an example of such a substrate.

Figure 10:
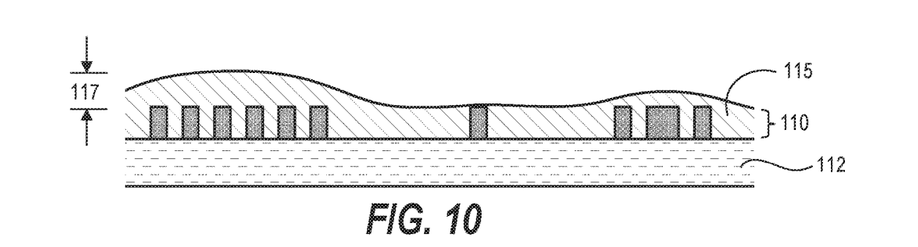
FIG. 10 is a cross-sectional schematic view of an example substrate segment showing a process flow according to embodiments disclosed herein.

A filler layer 115 of filler material is deposited on the substrate 105 as shown in FIG. 10. The filler layer 115 fills spaces between respective micro-fabricated structures 110 and covers at least a portion of the micro-fabricated structures 110. The filler layer 115 results in a top surface that is non-planar in that top surface locations of the filler layer 115 differ in z-height compared to each other by approximately 1-100 nanometers. Dimension 117 shows the relative difference in z-height of filler layer 115 from a tallest z-height to a shortest z-height of the filler layer. The filler layer 115 includes a generator compound. The generator compound is a compound that generates a solubility-changing agent in response to receiving actinic radiation exposure. The generator compound can be a photo acid generator. In some embodiments, the generator compound can be randomly/evenly distributed throughout the filler layer 115. In alternative embodiments, the generator compound can be attached to a migrating polymer that migrates to a top portion of the filler layer after the filler layer is deposited via spin-on deposition. For example, a given PAG can be attached to a fluorinated polymer or other polymer with a molecular weight that will rise to the surface during deposition. Thus, in some embodiments, a PAG can be evenly distributed throughout a developable material, or can have a vertical density profile that is not uniform. FIG. 10 is an example result of filler layer 115 deposition.

Next, a pattern of actinic radiation is projected onto the substrate. The pattern of actinic radiation is projected using a digital pixel-based projection system having an array of independently addressable projection points. The pattern of actinic radiation causes the generator compound to generate the solubility-changing agent such that a concentration of the solubility-changing agent generated at a given point location on the substrate is selectably controlled by an exposure intensity of actinic radiation at the given point location. A particular projected pattern can be based on a z-height signature that spatially characterizes z-height values of the top surface of the filler layer across the substrate as described above.

Figure 11:
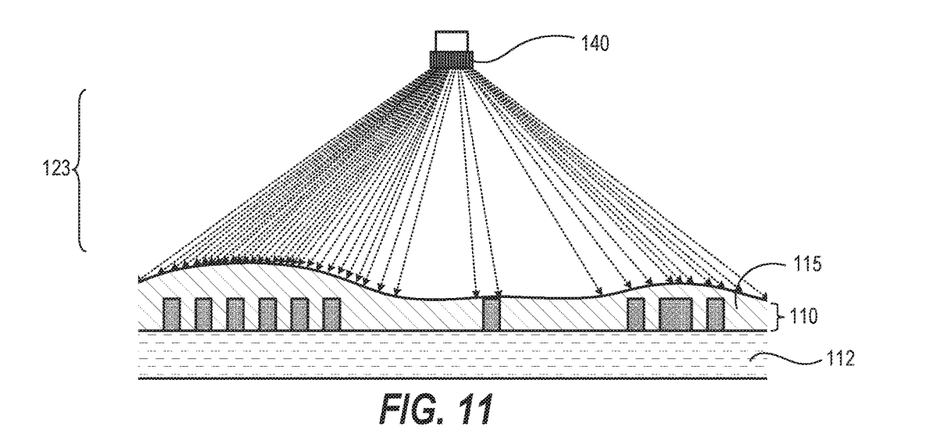
FIG. 11 is a cross-sectional schematic view of an example substrate segment showing a process flow according to embodiments disclosed herein.
Figure 12:
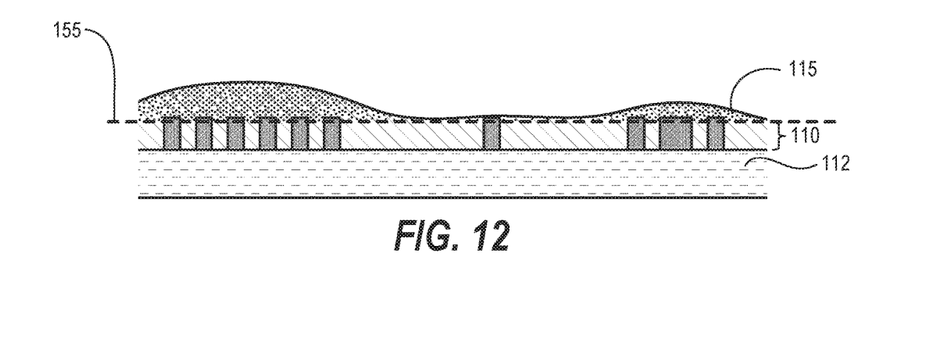
FIG. 12 is a cross-sectional schematic view of an example substrate segment showing a process flow according to embodiments disclosed herein.

FIG. 11 is an example illustration of a projected pattern of radiation with light intensity selectively varied by spatial location. FIG. 12 shows that a solubility-changing agent has been generated within filler layer 115 above line 155. Note that the solubility-changing agent can be generated below line 155, but typically there is a threshold concentration required to change a solubility of portions of the filler layer.

Figure 13:
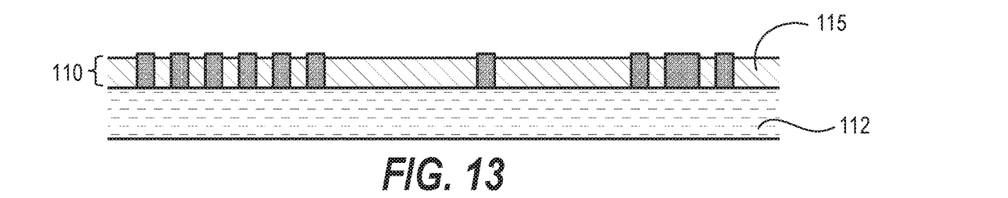
FIG. 13 is a cross-sectional schematic view of an example substrate segment showing a process flow according to embodiments disclosed herein.
Figure 14:
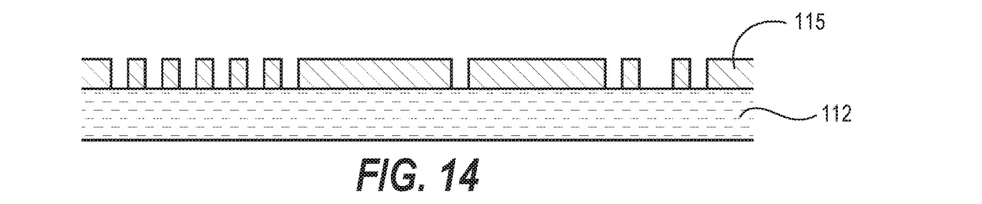
FIG. 14 is a cross-sectional schematic view of an example substrate segment showing a process flow according to embodiments disclosed herein.

Soluble portions of the filler layer can then be removed using a developing agent. A result of such removal is shown in FIG. 13. As can be appreciated, after planarizing a given substrate any number of additional fabrication techniques and patterning processes can be executed. For example, additional lithographic (photomask-based) patterning can be executed. With just top portions of underlying structures exposed, work function tuning can be executed, and selective deposition on just tops of features are other optional processes. In another example a reversal process can be executed. FIG. 14 shows that the micro-fabricated structures 110 have been removed (such as by etching), and the result is that the filler layer 115 can now be used a mask to transfer the defined pattern into an underlying layer.

Another embodiment includes a method for planarizing a substrate. A substrate is received or provided having micro-fabricated structures formed thereon. The micro-fabricated structures are positioned on an upper portion of the substrate. At least a portion of the micro-fabricated structures define open spaces between each other. In other words, the structures can define a relief pattern or topology. The substrate also has a filler layer of filler material deposited on the substrate. The filler layer fills spaces between the micro-fabricated structures and covers at least a portion of the micro-fabricated structures. The filler layer results in a top surface that is non-planar in that top surface locations of the filler layer differ in z-height compared to each other by approximately 1-100 nanometers. The substrate also has a generator compound deposited thereon. The generator compound is a compound that generates a solubility-changing agent in response to receiving actinic radiation exposure. Note that the generator compound can be included in the filler layer or, alternatively, deposited on top of the filler layer either alone or within a height-adjustment layer.

A pattern of actinic radiation is then projected or exposed onto the substrate. The pattern of actinic radiation is projected using a photolithographic projection system that uses a reticle (photomask) to form the pattern. In other words, a mask-based exposure system, such as a scanner or stepper can be used in place of a pixel-based projection system. Either type of light projection or exposure system can be used with techniques herein. Each type of system can provide benefits. Using a photomask-based projection system (photolithographic scanner or stepper) it is possible to expose a pattern of light in very high resolution. Using a pixel-based projection system it is possible to quickly (dynamically) change a pattern of light projected using software. The pattern of actinic radiation can be based on a z-height signature that spatially characterizes z-height values of the top surface of the filler layer across the substrate. In embodiments in which the generator compound is deposited on top of the filler layer, a bake step can be executed to cause a generated solubility-changing agent to diffuse into the filler layer to change a solubility of a top portion of the filler layer.

As can be appreciated, many embodiments, features and advantages are provided by techniques herein. For example, planarization materials can include using a photo acid generator in an I-line photoresist. The area exposed with I-line light undergoes thickness loss which is strongly correlated to the de-protection of a topcoat-less photoresist. This thickness loss can serve as a reliable de-protection and can be used to planarize the top of the resist by varying a dose profile across the substrate using I-line lithography (photomask-based or pixel-based projection), thereby being able to provide selective planarization on track-type tools without using CMP tools or slurries. Using track-type tools with techniques herein increases yield as well as reducing costs.

Alternatively, embodiments herein can be used with any of various types of resists or developable materials. In some applications, using an I-line resist can be beneficial. For example, some pixelated light sources can provide a higher intensity profile when treating an I-line responsive photoresist, which can provide uniform results and a longer lifetime. Other resists and light combinations can also provide effective results. For example, in some embodiments, a 266 nanometer (nm) light source can be used with a 193 nm resist or 248 nm resist sensitive to the 266 nm exposure. Alternatively, a 193 nm light source can be used. A 193 nm light source can also be used with an EUV (extreme ultraviolet)-responsive resist with an EUV-designed PAG. Note that there is some flexibility with a selected wavelength due to quantum mechanical interactions. A given selected PAG species is deterministic from the absorption profile of the material. For example, a photoresist designed to respond to EUV wavelength light, can nevertheless have an absorption profile that encompasses 172 nm light and 193 nm light. Accordingly, a 193 nm light source can be used with an EUV resist. On the other end of one spectrum, a 266 nm absorption profile can be used to generate sensitivity upstream in the 365 nm place. Other PAGs can also be included that have a lower absorption profile. The absorption profile indicates what wavelength or wavelengths will interact with a PAG. When a line width intersects with an absorption profile with a quantum mechanical process function that is sufficiently efficient to trigger a de-protection reaction and create photo acid, then such a resist and pixelated light source combination will be sufficient to cause planarization as described herein. Thus, many different light sources and film combinations are possible.

A given pixel-based light source (such as a digital light processing (DLP) projector system or chip, or a laser galvanometer) can reflect a given light source and focus the light on the substrate. Various different light sources can be used with embodiments herein. For example, an I-Line lamp, LED, etc. can be used. To assist dose variation, a digital pixel-based light system can vary its light projection angle (intensity) and thereby change a dose profile across a substrate surface. After exposure, a substrate can be baked (post exposure bake) and developed resulting in a z-height loss defined by an initial filler layer thickness (at a given coordinate location) minus a resulting filler layer thickness (at a corresponding coordinate location). Note that a concentration of photo acid generated can control a z-height loss, and a concentration of photo acid generated is dependent on a dose. A higher light dose at a given point creates more photo acid which drives a deeper de-protection reaction at that point. Likewise, a lesser dose of light results in less photo acid created and a shallow de-protection reaction or no de-protection reaction. A given dose can be manipulated so that a projected pattern is just exposed without any dishing or inadequate planarization. Inadequate planarization can include removing a given thickness, but without uncovered tops of underlying structures. A desired thickness loss across a substrate can be varied by changing the angle/intensity of the digital pixel-based light source. A z-height manipulation can be controlled by the amount of PAG loading in a resist and the dose applied. A selected PAG plus planarization material can be high or low resolution, such as with chemically amplified I-line PAG resists.

Embodiments can be executed with one or more layers of developable material, and with a generator compound within an initial layer of developable material, or deposited on top of a layer of developable material. Using a topcoat-less resist, solubility-shifting components are included in this planarization material to function in situ on a film of interest. When using a single coat, it can be beneficial to have a material with a residual $R_{min}$ (minimum develop rate with no light). With such material, the $R_{min}$ becomes tunable. $R_{min}$ is a function of what is a natural solubility of a given material as well as de-protection species within that material. The de-protection species can then be triggered regionally by a PAG. The photo acid generator generates a de-protection group, and then the de-protection group changes the $R_{min}$. The result is that a natural/initial $R_{min}$ (which might be, for example, 5% per developer process with tetramethylammonium hydroxide (TMAH) 2.38%) changes because some de-protection occurred in a region of interest. As a result, a given material can change a minimum development rate to be, for example, 20-30% of the material instead of, for example, 5%.

Using two layers, the second layer/material can be (or include) an acid generator. This acid generator can be uniquely tuned. With a double coat, the topcoat or overcoat can be tuned to interact with a pixel-based exposure. After generating photo acid in this topcoat, a solvent drive can be executed on the topcoat that drives photo acid directly downward into material capable of having a solubility shift. With selective projection of light, a solubility shift of material only occurs in regions of interest on the substrate that would improve/provide planarization. In other words, a photo acid concentration can be accurately created at desired locations on the substrate.

Using a double coat can be beneficial because the planarization material can be optionally selected as something other than a conventional photoresist. The planarization material needs to be developable, but can be silicon containing or metal containing, for example. Adding silicon, metals (titanium, tin, etc.) or other nanoparticles to a developable layer is beneficial for creating and recessing a hardmask material, which can then be used as a reversal structure. Moreover, with a dual coat embodiment, planarization techniques can be exposed to a range of exposure doses and wavelengths that can trigger creation of a range of acids to cause a z-height change. This planarization material can be applied over different topographical zones and duty cycle zones which will create areas which are either thicker or thinner. For some fabrication processes, it is desirable to have a non-destructive planarization option to planarize in one level with all of the features/structures sitting against or above the top surface, or even protruding out of the top surface. To execute this planarization, a height-adjustment film or over coat covers a filler layer of developable material. The height-adjustment film provides for adjusting z-height diffusivity of overcoat material, such as photo acid. A molecular weight of a selected photo acid can then tune a z-height. A diffusivity and exposure dose can be calculated and then z-height can be adjusted accurately across a given substrate.

Selectably controlling planarization can be a function of a concentration of a solubility-changing agent generated at each given region or coordinate point location. A light intensity at each pixel spot on a substrate can control this concentration. In some embodiments, a diffusivity of the angle and the distributed angle can be in a calibration file or other memory location for generating a projected image. When initially calibrating for a planarization process, a flood dose across an entire substrate without underlying structures to cause z-height differences can be executed to identify how much z-height correction is possible for a given film and light combination. This calibration can then assist creation of subsequent signature-based projections. More acid generated typically correlates to a longer diffusion length into a developable material, that is, a longer distance from the upper surface that a solubility shift will occur. A given selected photo acid can have an average diffusion length. In most developable materials, what controls triggering a solubility shift is a total concentration of photo acid within a developable material. Thus a higher concentration of photo acid above/within a given spatial location on a substrate will result in a deeper solubility change. By manipulating the acid concentration in a given area to generate more or less acid, an acid diffusion front is controlled. Thus, with a sufficient concentration of acid, the acid de-protects the developable material and a developer can then dissolve this portion of solubility-shifted material. Thus, the higher the concentration over a given area, the deeper an acid front is driven into the film. Some concentration of photo acid can diffuse below a target planarization line, but this acid does not have a concentration sufficient to trigger a solubility shift.

Average diffusion length of a given selected acid can be tuned by molecular weight. Embodiments can include using a twin PAG system or multiple PAG system. One or more different types of PAGs can be used. For example, some acids can be selected to rapidly diffuse a short distance and stop, and then other acids can be selected to diffuse more slowly but a longer distance (on average). This can be used to provide a high concentration gradient at one edge. PAG blends can be used to engineer the diffusion front of the acid to make a highest concentration profile in a region of interest to shift solubility as designed.

Thus, z-height diffusion is controlled by concentration and molecular weight of acids. An x-y or spatial resolution of z-height adjustments can be dependent on a particular light projection technology used. For example, spatial resolution can be as high as a selected DLP chip or laser galvanometer can provide. Conventional pixel-based projection systems can provide a spatial resolution of about 100 microns or so. Spatial resolution can be increased by using higher-resolution digital projection systems or by implementing techniques herein with a photomask lithographic exposure system (such as a scanner or stepper). In other words, instead of using a digital pixel-based projection system for spatial light projection to cause z-height adjustment, a photolithographic scanner tool can be used. The benefit of using a digital pixel-based projection system is that a digitized signature of a substrate can be fed into a digital pixel-based projection system so that a given light projection pattern can be based on that signature and digitally created or modified essentially immediately without any hardware modification. Light pattern creation speed is then limited by computer processing speed. The benefit of using a scanner for z-height adjustment exposure is that better spatial resolution can typically be achieved as compared to a digital pixel-based projection system projection resolution. For example, using a scanner, z-height adjustments can have spatial resolutions on the order of tens of nanometers. Using a scanner/stepper, typically requires creation of a reticle and so a speed of implementing this higher spatial resolution option is controlled by time for creating a photomask/reticle. One other advantage with using a digital pixel-based projection system is that such systems can be very cost-effective. Accordingly, there are many light projection options, materials options, and flow options as described herein. It can be appreciated that various combinations of these options can provide effective, non-destructive planarization techniques for meeting various fabrication designs.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of planarizing a substrate, the method comprising:
receiving a substrate having micro-fabricated structures formed thereon, the micro-fabricated structures being positioned on an upper portion of the substrate, at least a portion of the micro-fabricated structures defining open spaces between each other;
depositing a filler layer of filler material on the substrate, the filler layer filling spaces between the micro-fabricated structures and covering at least a portion of the micro-fabricated structures, the filler layer resulting in a top surface that is non-planar in that top surface locations of the filler layer differ in z-height compared to each other by approximately 1-100 nanometers;
depositing a generator compound on the filler layer, the generator compound being a compound that generates a solubility-changing agent in response to receiving actinic radiation exposure;
projecting a pattern of actinic radiation onto the substrate, the pattern of actinic radiation being projected using a digital pixel-based projection system having an array of independently addressable projection points, the pattern of actinic radiation causing the generator compound to generate the solubility-changing agent such that a concentration of the solubility-changing agent generated at a given point location on the substrate is selectably controlled by an exposure intensity of actinic radiation at the given point location;

causing the solubility-changing agent to diffuse into at least a portion of the filler layer such that the solubility-changing agent changes a solubility of a top portion of the filler layer; and removing soluble top portions of the filler layer using a developing agent, wherein projecting the pattern of actinic radiation onto the substrate includes varying an amount of actinic radiation projected onto the substrate based on a z-height signature that spatially characterizes z-height values of the top surface of the filler layer across the substrate.

2. The method of claim 1, further comprising generating the z-height signature based on a topology of the microfabricated structures on the substrate.

3. The method of claim 1, wherein depositing the generator compound includes depositing a photo acid generator, and wherein projecting the pattern of actinic radiation causes the photo acid generator to generate a photo acid such that a concentration of the photo acid at a given spatial location on the substrate is based on the z-height signature.

4. The method of claim 1, wherein projecting the pattern of actinic radiation onto the substrate includes projecting the pattern of actinic radiation based on a z-height signature that spatially characterizes z-height values of the top surface of the filler layer across the substrate such that an amount of solubility-changing agent generated at each projected pixel location on the substrate is based on an intensity of actinic radiation projected at each pixel location.

5. A method of planarizing a substrate, the method comprising:
receiving a substrate having micro-fabricated structures formed thereon, the micro-fabricated structures being positioned on an upper portion of the substrate, at least a portion of the micro-fabricated structures defining open spaces between each other;

depositing a filler layer of filler material on the substrate, the filler layer filling spaces between the micro-fabricated structures and covering at least a portion of the micro-fabricated structures, the filler layer resulting in a top surface that is non-planar in that top surface locations of the filler layer differ in z-height compared to each other by approximately 1-100 nanometers;

depositing a generator compound on the filler layer, the generator compound being a compound that generates a solubility-changing agent in response to receiving actinic radiation exposure;

projecting a pattern of actinic radiation onto the substrate, the pattern of actinic radiation being projected using a digital pixel-based projection system having an array of independently addressable projection points, the pattern of actinic radiation causing the generator compound to generate the solubility-changing agent such that a concentration of the solubility-changing agent generated at a given point location on the substrate is selectably controlled by an exposure intensity of actinic radiation at the given point location; and causing the solubility-changing agent to diffuse into at least a portion of the filler layer such that the solubility-changing agent changes a solubility of a top portion of the filler layer, wherein projecting the pattern of actinic radiation onto the substrate includes varying an amount of actinic radiation projected onto the substrate based on a z-height signature that spatially characterizes z-height values of the top surface of the filler layer across the substrate, and wherein depositing the filler layer of filler material includes depositing a developable material in that the developable material has a solubility shift in response to presence of solubility-changing agents above a predetermined concentration threshold.

6. The method of claim 5, wherein depositing the filler layer of filler material includes the filler material containing a hard mask material.

7. The method of claim 6, further comprising using the filler layer as a mask to transfer a filler layer pattern into an underlying layer.

8. A method of planarizing a substrate, the method comprising:
receiving a substrate having micro-fabricated structures formed thereon, the micro-fabricated structures being positioned on an upper portion of the substrate, at least a portion of the micro-fabricated structures defining open spaces between each other;

depositing a filler layer of filler material on the substrate, the filler layer filling spaces between the micro-fabricated structures and covering at least a portion of the micro-fabricated structures, the filler layer resulting in a top surface that is non-planar in that top surface locations of the filler layer differ in z-height compared to each other by approximately 1-100 nanometers;

depositing a generator compound on the filler layer, the generator compound being a compound that generates a solubility-changing agent in response to receiving actinic radiation exposure;

projecting a pattern of actinic radiation onto the substrate, the pattern of actinic radiation being projected using a digital pixel-based projection system having an array of independently addressable projection points, the pattern of actinic radiation causing the generator compound to generate the solubility-changing agent such that a concentration of the solubility-changing agent generated at a given point location on the substrate is selectably controlled by an exposure intensity of actinic radiation at the given point location; and causing the solubility-changing agent to diffuse into at least a portion of the filler layer such that the solubility-changing agent changes a solubility of a top portion of the filler layer, wherein projecting the pattern of actinic radiation onto the substrate includes varying an amount of actinic radiation projected onto the substrate based on a z-height signature that spatially characterizes z-height values of the top surface of the filler layer across the substrate, and wherein causing the solubility-changing agent to diffuse into at least a portion of the filler layer includes baking the substrate at a predetermined time and temperature to result in a predetermined acid diffusion distance into the filler layer.

* * * * *